US008669779B2

(12) United States Patent
Gill et al.

(10) Patent No.: US 8,669,779 B2
(45) Date of Patent: Mar. 11, 2014

(54) SYSTEMS, PIPELINE STAGES, AND COMPUTER READABLE MEDIA FOR ADVANCED ASYNCHRONOUS PIPELINE CIRCUITS

(75) Inventors: Gennette Delaine Gill, New York, NY (US); Montek Singh, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 0 days.

(21) Appl. No.: 13/001,034

(22) PCT Filed: Jun. 29, 2009

(86) PCT No.: PCT/US2009/049109
§ 371 (c)(1),
(2), (4) Date: Apr. 5, 2011

(87) PCT Pub. No.: WO2010/039312
PCT Pub. Date: Apr. 8, 2010

(65) Prior Publication Data
US 2011/0169525 A1    Jul. 14, 2011

Related U.S. Application Data

(60) Provisional application No. 61/076,355, filed on Jun. 27, 2008.

(51) Int. Cl.
*H03K 19/177* (2006.01)
(52) U.S. Cl.
USPC .......................................... 326/39
(58) Field of Classification Search
USPC .......................... 326/37–47, 101
See application file for complete search history.

(56) References Cited

U.S. PATENT DOCUMENTS 5,386,585 A    1/1995   Traylor
5,572,690 A    11/1996  Molnar et al.
(Continued)

FOREIGN PATENT DOCUMENTS

EP    0 913 768 A2    5/1999
WO    WO 01/82053 A2    11/2001
(Continued)

OTHER PUBLICATIONS

International Search Report for International Application No. PCT/US2009/049109 (Apr. 28, 2010).

(Continued)

*Primary Examiner* — Thienvu Tran
(74) *Attorney, Agent, or Firm* — Jenkins, Wilson, Taylor & Hunt, P.A.

(57) ABSTRACT

Systems, pipeline stages, and computer readable media for advanced asynchronous pipeline circuits are disclosed. According to one aspect, the subject matter described herein includes a configurable system for constructing asynchronous application specific integrated data pipeline circuits. The system includes multiple modular circuit stages that are connectable with each other using transitional signaling and with other circuit elements to form multi-stage asynchronous application-specific integrated data pipeline circuits for asynchronously passing data through a series of stages based on a behavior implemented by each stage. The modular circuit stages each include sets of logic gates connected to each other for implementing the behaviors, the behaviors including at least one of conditional split, conditional select, conditional join, merge without arbitration, and stage arbitration.

9 Claims, 12 Drawing Sheets

(56) References Cited

U.S. PATENT DOCUMENTS

| | | | |
|---|---|---|---|
| 5,600,848 | A | 2/1997 | Sprouil et al. |
| 5,732,233 | A | 3/1998 | Kim et al. |
| 5,920,899 | A | 7/1999 | Chu |
| 6,028,453 | A | 2/2000 | Kong |
| 6,067,417 | A | 5/2000 | Wise et al. |
| 6,590,424 | B2 | 7/2003 | Singh et al. |
| 6,867,620 | B2 | 3/2005 | Singh et al. |
| 6,958,627 | B2 | 10/2005 | Singh et al. |
| 7,053,665 | B2 | 5/2006 | Singh et al. |
| 7,157,934 | B2 * | 1/2007 | Teifel et al. ............ 326/38 |
| 7,478,222 | B2 | 1/2009 | Fant |
| 7,913,007 | B2 | 3/2011 | Singh et al. |
| 2002/0069347 | A1 * | 6/2002 | Singh et al. ............ 712/216 |
| 2002/0141251 | A1 * | 10/2002 | Oh et al. ............ 365/189.12 |
| 2004/0046590 | A1 | 3/2004 | Singh et al. |
| 2004/0111589 | A1 | 6/2004 | Lines et al. |

FOREIGN PATENT DOCUMENTS

| | | |
|---|---|---|
| WO | WO 01/82064 A2 | 11/2001 |
| WO | WO 01/95089 A2 | 12/2001 |
| WO | WO 02/35346 A1 | 5/2002 |
| WO | WO 2010/039312 A3 | 4/2010 |

OTHER PUBLICATIONS

Sparso, Jens et al., Principles of Asynchronous Circuit Design. 2001.

International Preliminary Report on Patentability for International Application No. PCT/US2009/049109 (Jan. 13, 2011).

Notice of Allowance and Fee(s) Due for U.S. Appl. No. 12/240,938 (Dec. 28, 2010).

Notice of Allowance and Fee(s) Due for U.S. Appl. No. 12/240,938 (Nov. 4, 2010).

Official Action for U.S. Appl. No. 12/240,938 (Jun. 14, 2010).

Gill et al, "Performance Estimation and Slack Matching for Pipelined Asynchronous Architectures with Choice," IEEE, pp. 449-456 (2008).

Sokolov et al., "Asynchronous Data Path Models," The Computer Society, pp. 1-12 (2007).

Ampalam et al. "Counterflow Pipelining: Architectural Support for Preemption in Asynchronous Systems using Anti-Tokens," ACM. ICCAD '06., pp. 611-618 (Nov. 9, 2006).

Brej, "Early Output Logic and Anti-Tokens," Thesis submitted to the University of Machester School of Computer Science, pp. 1-137 (Sep. 2005).

Notice of Allowance and Fee(s) Due for U.S. Appl. No. 10/380,137 (Jul. 29, 2005).

Notice of Allowance and Fee(s) Due for U.S. Appl. No. 10/380,137 (Mar. 14, 2005).

Singh, "Clockless Logic," pp. 1-32 (Apr. 6, 2004).

Singh "The Design of High-Throughput Asynchronous Pipelines," Ph.D. Thesis, Columbia University, New York, NY, pp. 1-263 (Dec. 2002).

International Application Serial No. PCT/US01/29721 International Search Report (Sep. 21, 2001).

Singh et al., "Mousetrap: Ultra-High-Speed Transition-Signaling Asynchronous Pipelines." Proc. of IEEE Intl. Conf. on Computer Design (ICCD-01), pp. 9-17, Austin, TX (Sep. 2001).

Ebergen, "Squaring the FIFO in GasP," Proceedings, Seventh International Symposium on Advanced Research in Asynchronous Circuits and Systems (ASYNC 2001), pp. 194-205, IEEE Computer Society Press (Mar. 11-14, 2001).

Sutherland et al., "GasP: A Minimal FIFO Control," In Proceedings on International Symposium on Advanced Research on Asynchronous Circuits and Systems (ASYNC), pp. 46-53, IEEE Computer Society Press (Mar. 2001).

Singh et al., "Mousetrap: Ultra High-Speed Transition-Signaling Asynchronous Pipelines," ACM "Tau-00" workshop, ACM Workshop on Timing Issues in the Specification and Synthesis of Digital Systems (Dec. 4-5, 2000).

Molnar et al., "Simple Circuits that Work for Complicated Reasons," Proceedings in International Symposium on Advanced Research on Asynchronous Circuits and Systems (ASYNC), pp. 138-149 (Apr. 2000).

Singh et al., "Fine-Grained Piplined Asynchronous Adders for High-Speed DSP Applications," In IEEE Computer Soicety Annual Workshop on VLSI, IEEE Computer Society Press, pp. 1-8 (Apr. 27-28, 2000).

Schuster et al., "Asynchronous Interlocked Pipelined CMOS Circuits Operating at 3.3-4.5 GHz," Proceedings of the International Solid State Circuits Conference, pp. 292-293 (Feb. 2000).

Singh et al., "High-Throughput Asynchronous Pipelines for Fine-Grain Dynamic Datapaths," In Proceedings of the International Symposium on Advanced Research in Asynchronous Circuits and Systems ("Async2000"), pp. 1-12 (Apr. 2-6, 2000).

Schuster et al., "Asynchronous Interlocked Pipelined CMOS Circuits Operating at 3.3-4.5GHz," IEEE International Solid-State Circuits Conference, pp. 1-2 (2000).

Hauck et al., "Two-Phase Asynchronous Wave-Piplines and Their Application to a 2D-DCT," Proceedings in International Symposium on Advanced Research on Asynchronous Circuits and Systems, (ASYNC), pp. 1-10 (Apr. 1999).

Molnar et al., "Two FIFO Ring Performance Experiments," Proceedings of the IEEE, vol. 87, No. 2, pp. 297-307 (Feb. 1999).

Van Berkel et al., "Scanning the Technology: Applications of Asynchronous Circuits," Proceedings of the IEEE, vol. 87, No. 2, pp. 223-233 (Feb. 1999).

Dooply et al., "Optimal Clocking and Enhanced Testability for High-Performance Self-Resetting Domino Pipelines," ARVLSI, pp. 1-15 (1999).

Mukherjee et al., Wave Sterring in YADDs: A Novel Non-Iterative Synthesis and Layout Technique, Proc. DAC, pp. 1-6 (1999).

van Gageldonk et al., "An Asynchronous Low-Power 80C51 Microcontroller," Proceedings in International Symposium on Advanced Research on Asynchronous Circuits and Systems (ASYNC), pp. 96-107 (1998).

Harris et al., "Skew-Tolerant Domino Circuits," IEEE Journal of Solid-State Circuits, vol. 32, No. 11, pp. 1702-1711 (Nov. 1997).

Nowick et al., "Speculative Completion for the Design of High-Performance Asynchronous Dynamic Adders," In 1997IEEE International Symposium on Advanced Research in Asynchronous Circuits and Systems, pp. 210-223 (Apr. 1997).

Molnar, et al. "A FIFO Ring Performance Experiment," IEEE, pp. 279-289 (1997).

Martin et al., "The Design of an Asynchronous MIPS R3000 Microprocessor," Advanced Research in VLSI, pp. 164-181 (Sep. 1997).

Singh et al., "Matching Structural Shape Descriptions Using Genetic Algorithms," Pattern Recognition, vol. 30, No. 9, pp. 1451-1462 (1997).

Narayanan et al., "Static Timing Analysis for Self Resetting Circuits," Proc. ICCAD, pp. 119-126 (1996).

Yee et al. "Clock-Delayed Domino for Adder and Combinational Logic Design," Proceeding ICCD, pp. 332-337 (Oct. 1996).

Furber et al., "Four-Phase Micropipeline Latch Control Circuits," IEEE TVLSI, vol. 4, No. 2, pp. 247-253 (Jun. 1996).

Yun et al., "High-Performance Asynchronous Pipelines Circuits," Proceedings International Symposium on Advanced Research on Asynchronous Circuits and Systems (ASYNC), pp. 118-123 (1996).

Day et al., "Investigation Into Micropipeline Latch Design Styles," IEEE Transactions on Very Large Scale Integration, vol. 3, No. 2, pp. 264-272 (Jun. 1995).

Borah et al., "High-Throughput and Low-Power DSP Using Clocked-CMOS Circuitry," Proceedings in International Symposium On Low-Power Design, pp. 139-144 (1995).

Davis et al., "Asynchronous Circuit Design: Motivation, Background, and Methods," Asynchronous Digital Circuit Design, Birtwistle et al., (eds.), Workshops in Computing, Springer-Verlag, pp. 1-49 (1995).

(56) References Cited

OTHER PUBLICATIONS

Furber, "Computing Without Clocks: Micropipelining the ARM Processor," Asynchronous Digital Circuit Design, Workshops in Computing Birtwistle et al., (eds.) Springer-Verlag, pp. 211-262 (1995).
McLaughlin et al., "A Static Technique for High-Speed CMOS State Machine Design," ASIC Conference and Exhibit, 1994 Proceedings, Seventh Annual IEEE International Rochester, NY USA Sep. 19-23, 1994, New York, NY, USA IEEE, pp. 108-111, XP010140513 ISBN: 0-7803-2020-4 the whole document (Sep. 19.
Liu et al., "A 250-MHz Wave Pipelined Adder in 2-μm CMOS," IEEE JSSC, vol. 29, No. 9, pp. 1117-1128 (Sep. 1994).
Wong et al., "Designing High-Performance Digital Cirbuits Using Wave-Pipelining," IEEE Transactions on Computer-Aided Design of Integrated Circuits and Systems, vol. 12, No. 1, pp. 24-46 (Jan. 1993).
Williams, "Self-Timed Rings and Their Application to Division," Ph.D. Thesis, Stanford University, pp. 1-157 (May 1991).
Sutherland, "Micropipelines," Communications of the ACM, vol. 32, No. 6, pp. 720-738 (Jun. 1989).
Seitz, "System Timing," Introduction to VLSI Systems, Chapter 7, Med et al., (eds.), Addison-Wesley, pp. 218-262 (1980).

\* cited by examiner

SYSTEMS, PIPELINE STAGES, AND COMPUTER READABLE MEDIA FOR ADVANCED ASYNCHRONOUS PIPELINE CIRCUITS

PRIORITY CLAIM

This application claims the benefit of U.S. Provisional Patent Application Ser. No. 61/076,355, filed Jun. 27, 2008; the disclosure of which is incorporated herein by reference in its entirety.

GOVERNMENT INTEREST

This presently disclosed subject matter was made with U.S. Government support under Contract No. KT3408 awarded by the Defense Advanced Research Projects Agency (DARPA).

TECHNICAL FIELD

The subject matter described herein relates to methods and systems for implementing pipelined processing. More particularly, the subject matter described herein relates to systems, pipelines stages, and computer readable media for advanced asynchronous pipeline circuits.

BACKGROUND

As synchronous designs are increasingly facing challenges due to fundamental limitations of clocking, the VLSI design community has recently turned towards asynchronous logic to mitigate the challenges of global clock distribution in large complex high-speed systems. Asynchronous design offers several potential benefits, such as lower power consumption, higher performance, greater robustness, and significantly better modularity, all of which make asynchronous circuits a promising alternative to synchronous design.

When the problems that arise when using a global synchronous clock became apparent, the VLSI community started looking towards solving problems in asynchronous domain due to its inherent advantages. The main difference in the synchronous and asynchronous ideologies is the way timing between various modules is maintained. In a synchronous pipeline, for example, clocking gives a timing reference which dictates the completion of different stages. In asynchronous pipelines, however, timing is inferred by communication between the adjacent stages in the pipeline. This is referred to as handshaking. Handshaking protocols define the control behavior of asynchronous pipeline.

There are many areas where asynchronous circuits demonstrate clear advantages over their synchronous counterparts. Lower emissions of electromagnetic noise, no clock distribution (saving area and power), no clock skew, robustness to environmental variations (e.g. temperature and power supply) or transistor variations, better modularity and better security are just some of the properties for which most asynchronous designs have shown advantages over synchronous ones.

There are many different flavors of asynchronous design. However, the most commonly used approaches differ mainly in the following design choices.

Data Signaling/Encoding.

In dual rail encoded data, each Boolean (i.e., two-valued signal) is implemented as two wires, typically a data signal and a clock signal. This allows the value and the timing information to be communicated for each data bit. Bundled data, on the other hand, has one wire for each data bit and a separate wire to indicate the timing.

Control Signaling/Handshaking.

Level sensitive circuits typically represent a logic one by a high voltage and a logic zero by a low voltage. Transition signaling uses a change in the signal level to convey information.

Timing Model.

A speed independent design is tolerant to variations in gate speeds but not to propagation delays in wires while a delay insensitive circuit is tolerant to variations in wire delays as well.

The most popular form in recent years has been dual-rail encoding with level sensitive signaling. Full delay insensitivity is still achieved, but there must be a "return to zero" phase in each transaction, and therefore more power is dissipated than with transition signaling. The advantage of this approach over transition signaling is that the logic processing elements can be much simpler; familiar logic gates process levels whereas the circuits required to process transitions require state and are generally more complex.

FIG. 1 illustrates another conventional approach, which uses bundled data with a transition signaled handshake protocol to control data transfers. FIG. 1 shows the interface between a sender 100 and a receiver 102. Sender 100 and receiver 102 may be two stages of a multi-stage pipeline, for example. A bundle of data, such as databus 104, carries information, typically using one wire for each bit. A request signal (REQ) 106 is sent by the sender to the receiver and carries a transition when the data is valid. An acknowledge signal (ACK) 108 is sent from the receiver to the sender and carries a transition when the data has been used.

The protocol sequence is also shown as the timing diagram at the bottom of FIG. 1. At time T1, sender 100 places valid data on databus 104. At time T2, after some delay sufficient to allow the signals on databus 104 to stabilize, sender 100 causes a transition to occur on REQ 106. Receiver 102 may use the transition of REQ 106 to internally capture (e.g., latch) the values on databus 104. At time T3, after some delay sufficient to allow receiver 102 to guarantee that the data on databus 104 has been properly latched, receiver 102 may cause a transition to occur on ACK 108, to indicate to sender 100 that the data has been successfully received by receiver 104, after which time sender 100 may "release" the data, meaning that sender 100 need not maintain the valid data on databus 104. In some cases, sender 100 may stop driving databus 104, sometimes referred to as "tri-stating" the bus.

There have been a number of implementations of asynchronous pipelines, each approach having particular drawbacks. For example, Sutherland (Sun '89) describes 2-phase micro-pipelines that are elegant but expensive and slow. Molnar, Sutherland et al. '9701 describes a pipeline that is fast but requires fine-grain transistor sizing to achieve delay equalization and then needs extensive post-layout simulation to verify complex timing constraints. Schuster et al. ISSCC '00 describes a asynchronous pipeline that has very complex timing requirements and circuit structures. Williams '86 and Martin '97 describe dynamic pipelines that have no explicit latches and low latency but have poor cycle time (i.e., "throughput limited").

FIG. 2 is a block diagram illustrating a conventional transition signaling asynchronous pipeline implementation that supports simple forks and joins, which is disclosed in U.S. Pat. No. 6,958,627. The pipeline implementation disclosed therein is referred to as a "MOUSETRAP" pipeline. Pipeline 200 consists of multiple stages 202, two of which are shown in FIG. 2 as stage$_{N-1}$ 202A and stage$_N$ 202B. In one embodiment, each stage 202 includes a data latch 204 for latching incoming data 206, and a latch controller 208, which implements the latch enable logic. Latch controller 208 has 2 inputs, a request signal (REQ) 210 generated by the current stage and an acknowledgment signal (ACK) 212 from an adjacent stage, and outputs a latch enable signal 214. The function of latch controller 208 is to disable latch 204 when the inputs of latch controller 208 don't match, e.g., when a request has not been acknowledged. In one embodiment, latch controller 208 may be implemented using a simple XNOR gate 216. In one embodiment, latch 204 remains transparent when its stage 202 is waiting for data. As soon as data enters the stage, the data is captured by closing the latch behind it. The latch reopens when the data held by the latch is captured by the subsequent stage. This allows requests (along with data) to flow in the forward direction and their acknowledgments in the backward direction. A simple fork receives an input and forwards it to not one but multiple next stages, and waits for both next stages to acknowledge before accepting the next input data. A simple join receives input from not one but multiple input stages, and waits for both previous stages to request before merging the data from both input stages, latching the merged data, and forwarding the merged data to a single next stage.

However, behavior that is more sophisticated than a simple fork or simple join is desired. Accordingly, in light of these disadvantages associated with conventional implementations of asynchronous pipelines, there exists a need for improved systems, pipeline stages, and computer readable media for advanced asynchronous pipeline circuits using transitional signaling.

SUMMARY

According to one aspect, the subject matter described herein includes a configurable system for constructing asynchronous application specific integrated data pipeline circuits using transitional signaling. The system includes multiple modular circuit stages that are connectable with each other and with other circuit elements to form multi-stage asynchronous application-specific integrated data pipeline circuits for asynchronously passing data through a series of stages based on a behavior implemented by each stage. The modular circuit stages each include sets of logic gates connected to each other for implementing the behaviors, the behaviors including at least one of conditional split, conditional select, conditional join, merge without arbitration, and stage arbitration.

According to another aspect, the subject matter described herein includes an asynchronous application specific integrated data pipeline circuit, including a plurality of modular circuit stages that are connected with each other using transitional signaling and with other circuit elements to form multi-stage asynchronous application-specific integrated data pipeline circuits for asynchronously passing data through a series of stages based on a behavior implemented by each stage, the modular circuit stages each including sets of logic gates connected to each other for implementing the behaviors, the behaviors including at least one of conditional split, conditional select, conditional join, merge without arbitration, and stage arbitration.

According to another aspect, the subject matter described herein includes an asynchronous pipeline stage for implementing a conditional split. The stage includes a data latch for receiving data from a first data input and sending the received data to at least one of a plurality of data outputs, and a data latch controller for controlling the data latch, where the data latch controller receives a first data request using transitional signaling and a selection request, selects one data request output from a plurality of data request outputs based on the value of the selection request, and sends the data request to the selected data request output. Controlling the latch includes changing the latch to a closed mode in response to receipt of the first data request and the selection request, and changing the latch to a transparent mode in response to receipt of a data acknowledge associated with the selected data request output.

According to another aspect, the subject matter described herein includes an asynchronous pipeline stage for implementing a conditional select. The stage includes a data latch for receiving data from at least one of a plurality of data inputs and for sending the received data to a data output, and a data latch controller for controlling the data latch, where the data latch controller receives a selection request, selects one data request input from a plurality of data request inputs based on the value of the selection request, receives a data request using transitional signaling from the selected data request input, and sends the data request to a data request output. Controlling the latch includes changing the latch to a closed mode in response to receipt of the data request from the selected data request input and the selection request, and changing the latch to a transparent mode in response to receipt of a data acknowledge associated with the selected data request output.

According to another aspect, the subject matter described herein includes an asynchronous pipeline stage for implementing a conditional join. The stage includes a data latch for receiving data at each of a plurality of data inputs and for sending data from a selected one of the plurality of data inputs to a data output, and a data latch controller for controlling the data latch, where the data latch controller receives a selection request, selects one data request input from a plurality of data request inputs based on the value of the selection request, receives a data request using transitional signaling from the selected data request input, and sends the data request to a data request output. Controlling the latch includes changing the latch to a closed mode in response to receipt of the data request from the selected data request input and the selection request, and changing the latch to a transparent mode in response to receipt of a data acknowledge associated with the selected data request output.

According to another aspect, the subject matter described herein includes an asynchronous pipeline stage for implementing a merge without arbitration. The stage includes a data latch for receiving data at each of a plurality of data inputs and for sending the received data to a data output, and a data latch controller for controlling the data latch, where the data latch controller receives data requests from a plurality of data request inputs respectively associated with the plurality of data inputs and sends each received data request to a first data request output without arbitrating between the plurality of data request inputs. Controlling the latch includes changing the latch to a closed mode in response to receipt of the selection request and any of the data requests from the plurality of data request inputs, and changing the latch to a transparent mode in response to receipt of a data acknowledge associated with the first data request output.

According to another aspect, the subject matter described herein includes an asynchronous pipeline stage for implementing a stage arbitration. The stage includes a data latch for receiving data at each of a plurality of data inputs, each data input being associated with a respective data output, and a data latch controller for controlling the data latch, where the data latch controller receives a selection input and data requests from a plurality of data request inputs, selects one of the plurality of data request inputs based on a value of the selection input, and sends the data present at the selected data request input to a data request output associated with the selected data request input. Controlling the latch includes sending the data value that is present at the selected data input to the data output associated with the selected data input.

The subject matter described herein for asynchronous application specific integrated data pipeline circuits may be implemented in hardware, software, firmware, or any combination thereof. As such, the terms "function" or "module" as used herein refer to hardware, software, and/or firmware for implementing the feature being described. In one exemplary implementation, the subject matter described herein may be implemented using a computer readable medium having stored thereon computer executable instructions that when executed by the processor of a computer perform steps. Exemplary computer readable media suitable for implementing the subject matter described herein include disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Preferred embodiments of the subject matter described herein will now be explained with reference to the accompanying drawings, wherein like reference numerals represent like parts, of which.

DETAILED DESCRIPTION

Figure 1:
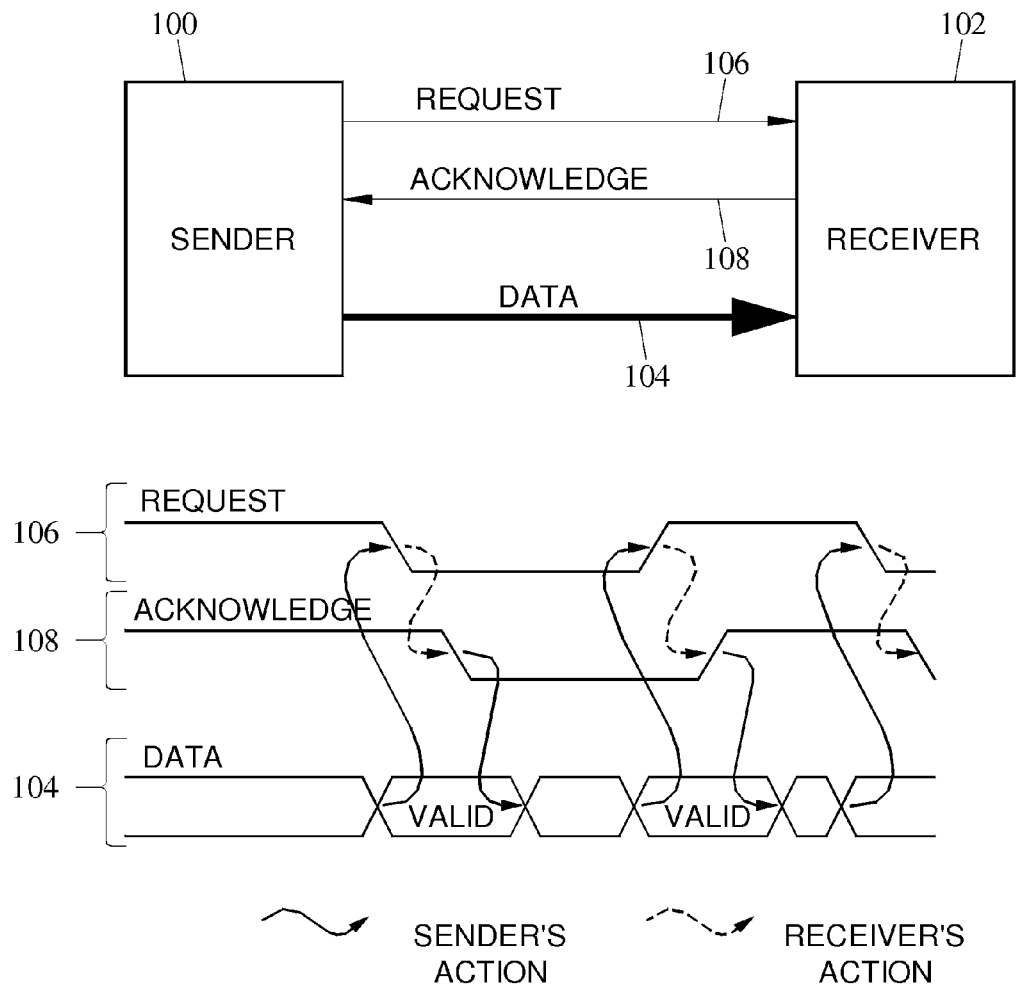
FIG. 1 is a block diagram illustrating a conventional pipeline that uses bundled data with a transition signaled handshake protocol to control data transfers.
Figure 2:
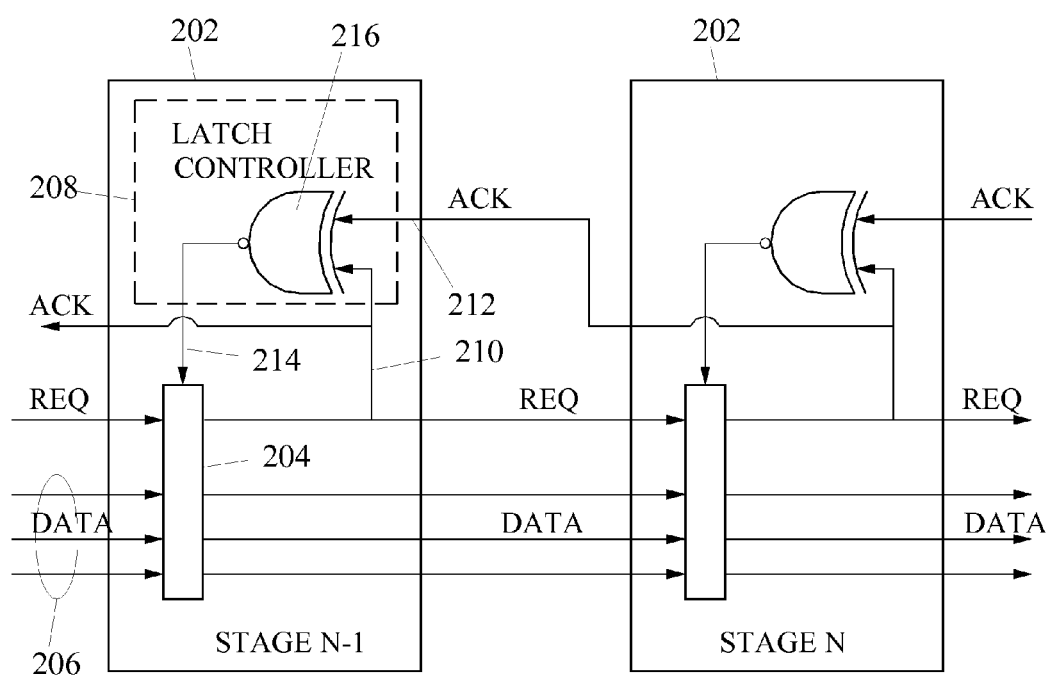
FIG. 2 is a block diagram illustrating a conventional transition signaling asynchronous pipeline implementation that supports simple forks and joins.

In accordance with the subject matter disclosed herein, systems, pipeline stages, and computer readable media are provided for advanced asynchronous pipeline circuits, including basic circuit-level building blocks for implementing a set of behaviors including conditional split, conditional select, conditional join, merge without arbitration, and stage arbitration.

As used herein, the term "conditional split" refers to a behavior in which data present at one input is sent to only one of multiple outputs selected according to a select value present at another input. For example, a conditional split pipeline stage (also referred to herein as a conditional split stage) may receive data from a previous pipeline stage and send the received data to one or the other, but not both, of two next pipeline stages, based on the value of a select input. The select value may be provided by the previous stage, the next stage, or some other logic. In one embodiment, the select value and the data value could be bundled together onto the same channel (i.e., the data itself includes the routing information). In other embodiments, the select value could be a value provided by the system without any handshaking (e.g., a global or external input, or a local value that changes infrequently). A conditional split differs from a simple split in that a conditional split sends the input to only one of the many outputs, while a simple split sends the input to all of the many outputs. An embodiment of a conditional split stage will be described in more detail in FIGS. 3A~3C, below.

As used herein, the term "conditional select" refers a behavior in which data present at one of many inputs may be sent to a single output, where the one input is selected from the many inputs based on a select value. In one embodiment, the select value is the value present at a dedicated select input. For example, a conditional select pipeline stage (also referred to herein as a conditional select stage) may have two data input channels, a third input channel that provides the select value, and one output channel. The value present on the select input will determine which of the two input channels' data will be read and sent to the output channel. A conditional select differs from a simple join in that a conditional select chooses one of many inputs and sends the selected input's data to the output, while a simple join merges the two inputs. Furthermore, a simple join performs the merge operation only when it has received requests from all of the multiple previous stages, while a conditional select only waits for a request from previous stage associated with the selected input. An embodiment of a conditional select stage will be described in more detail in FIGS. 4A~4B, below.

As used herein, the term "conditional join" refers to a behavior in which data present at all of many inputs is read, but data from only one of the inputs is sent to an output, based on a select value. A conditional join stage is similar to a conditional select stage, except that all input channels are read even though data from only one of them is forwarded. Data from the remaining input channels is discarded. An embodiment of a conditional join stage will be described in more detail in FIG. 5, below.

As used herein, the term "merge without arbitration" refers to a behavior in which data from multiple inputs is merged and sent to a single output without performing any arbitration between the multiple inputs. For example, a merge without arbitration pipeline stage (also referred to herein as a merge stage) may have two input channels and one output channel. Data is read from whichever input channel has new data and then sent to the output. No arbitration is provided; it is assumed that the input channels are mutually exclusive. A merge without arbitration differs from a simple join in that a simple join performs the merge operation only when it has received requests from all of the multiple previous stages, while a merge without arbitration sends to its output data from whichever input it has last received a request. An embodiment of a merge stage will be described in more detail in FIGS. 6A~6C, below.

As used herein, the term "stage arbitration" refers to a behavior in which data present on one of many input channels, the input channel being selected based on a select value, is sent to the input channel's corresponding output channel. For example, a stage arbitration pipeline stage (also referred to herein as an arbitration stage) may have two input channels, two output channels, and a select input. Only one input channel is read at any time, and its value is sent to its corresponding output channel. This circuit can be combined with the "merge without arbitration" behavior above to produce a "merge with arbitration." A stage arbitration differs from a both a simple split and a simple join in that a stage arbitration maintains a one-to-one association between in input and its corresponding output, while a simple split implements a one-to-many association and a simple join implements a many-to-one association. An embodiment of an arbitration stage will be described in more detail in FIG. 7, below.

The simple split and join stages may be collectively referred to as "basic MOUSETRAP stages" or simply "MOUSETRAP stages", while the conditional split, conditional select, conditional join, merge without arbitration, and stage arbitration stages may be collectively referred to as "advanced MOUSETRAP stages".

The conditional split and conditional select are designed to work together to implement an if-then-else construct without speculation (i.e., data is only sent along the chosen path). In particular, the conditional split first sends data along one of two paths, based on a Boolean value, thereby splitting one data stream into two. Subsequently, based on that Boolean value, the conditional select receives data from the correct path, thereby recombining the two data streams into one. The conditional split and conditional select can also be used separately (i.e., not necessarily as a pair).

The conditional join is designed to work with a simple fork stage to implement an if-then-else construct with speculation (i.e. data is sent along both paths, and the correct computed value is chosen later). In particular, the fork stage replicates an incoming data stream into two outgoing data streams. Subsequently, the conditional join reads the results from both the streams, and passes along the correct value based on the Boolean condition, and discards the other.

The merge stage, which simply interleaves two mutually-exclusive data streams into one, is useful for implementing several useful functions, e.g.: (i) a routing network, where conditional splits can route a data item into one of two or more directions, and merge stages can combine or recombine multiple streams into one; and (ii) pipelined for/while loops, where data cycling inside a ring must be merged with new data entering the ring. If mutual exclusion is not guaranteed at the system level, an arbitration stage can be added before the merge stage.

The circuit-level implementation and behavior for each of the advanced asynchronous pipeline circuits described above will now be described in more detail. In addition, equations for forward latency (the time between the arrival of a request and the generation of the request), and reverse latency (the time between the arrival of an incoming acknowledge and the generation of an outgoing acknowledge) are provided. In some cases, an equation for the hold time constraint is also provided, when it is more restrictive than the constraint for basic MOUSETRAP stages.

Figure 3A:
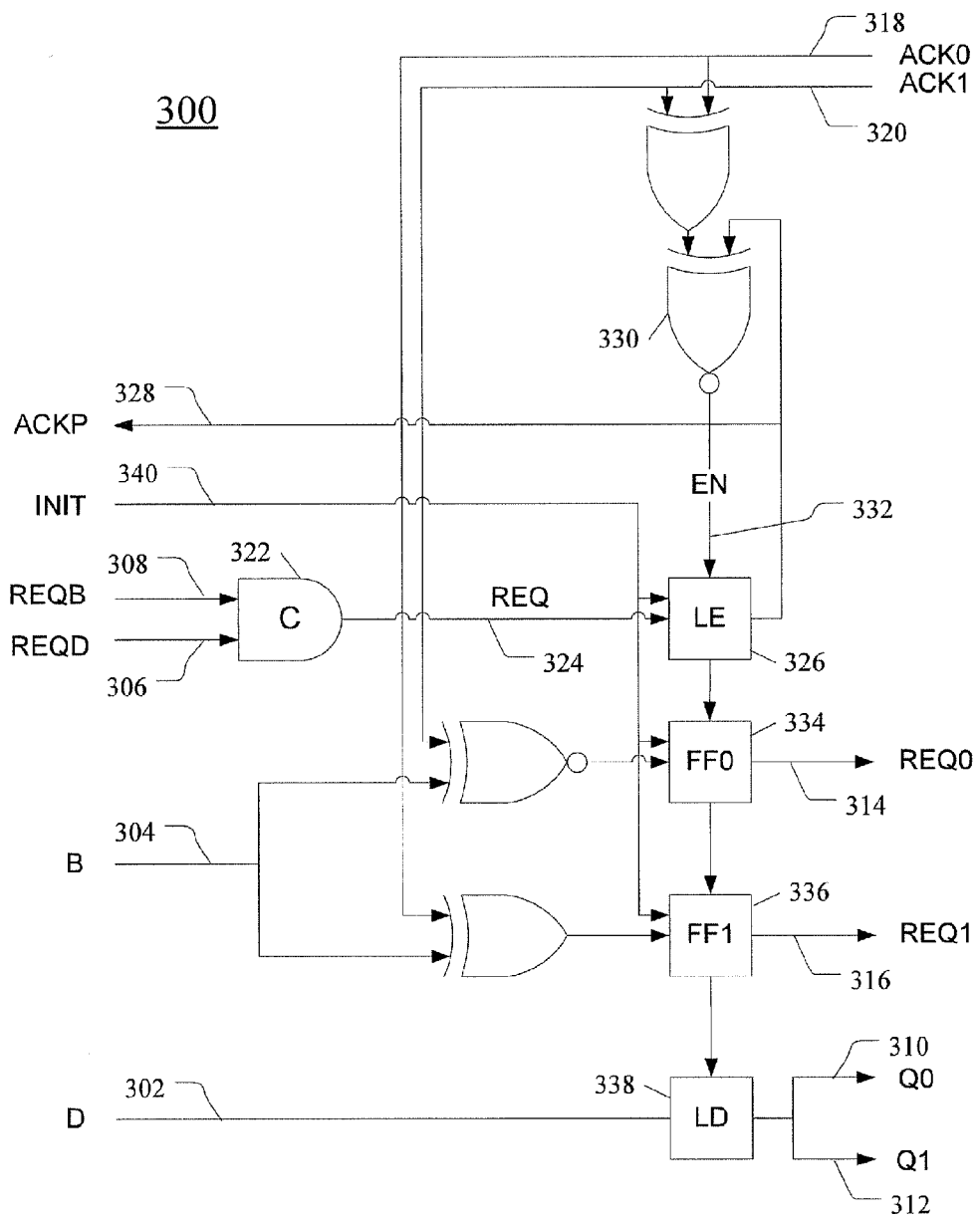
FIG. 3A is a block diagram illustrating a conditional split stage 300 according to an embodiment of the subject matter described herein.

FIG. 3A is a block diagram illustrating a conditional split stage 300 according to an embodiment of the subject matter described herein. A conditional split stage is similar to a router, in that it receives a data item from a first input channel and a select value from a second input channel. The data item is sent to one of multiple output channels, which is selected based on the select value. If there are only two output channels, the select value may be a Boolean value, e.g., having a value of '0' or '1'.

In one embodiment, each channel has one or more data lines and at least one request line. For example, a data input channel will have one or more data inputs and at least one request input. A data output channel will have one or more data outputs and at least one request output.

In the embodiment illustrated in FIG. 3A, conditional split stage 300 has a data input D 302, a select input B 304, a data request input REQD 306 and select request input REQB 308. Since the embodiment illustrated in FIG. 3 has only two outputs, data output Q0 310 and Q1 312, select input B 304 is a Boolean value Conditional split stage 300 waits for both REQD 306 and REQB 308 to be ready, and toggles only one of the outgoing request lines REQ0 314 or REQ1 316, depending on the value of select input B 304. The data input D 302 is simply copied to both data outputs Q0 310 and Q1 312, each of which goes a separate next stage. Conditional split stage 300 receives acknowledgements ACK0 318 and ACK1 320 from the next stages connected to Q0 310 and Q1 312, respectively.

Using the channel terminology describe above, conditional split stage 300 has one input channel consisting of data input D 302 and data request input REQD 306, another input channel consisting of select input B 304 and select request input REQB 308. Conditional split stage 300 has two data output channels: a first data output channel consisting of data output Q0 310 and request output REQ0 314, and a second data output channel consisting of data output Q1 312 and request output REQ1 316.

FIG. 3A illustrates a basic non-optimized implementation. In this implementation, a C-element 322 combines REQD 306 and REQB 308. The output of C-element 324 is a signal named REQ 324, which is sent to latch LE 326. The output of latch LE 326 is sent back to the previous stage as acknowledge signal ackP 328 and is also one input into 2-input exclusive NOR (XNOR) 330. The output of XNOR 330 is the enable signal EN 332.

A C-Element operates according to the following description: if all of the C-Elements inputs are the same value, the output of the C-Element becomes that value. Thus, if all inputs are logic "1", the output becomes logic "1", and if all inputs are logic "0", the output becomes logic "0". For any other combination of inputs, the C-Element does not change output value but instead maintains the last value that was output by the C-Element. This behavior makes the C-Element very useful for transition-based logic. The C-element may be modeled by an unclocked set/reset flip-flop, where the set input signal is a logical AND of all inputs to the C-element and the reset input signal is a logical AND of all inverted inputs to the C-element.

Select input B 304 is used to invert one of the incoming acknowledgement signals ACK0 318 or ACK1 320 to produce the appropriate requests on REQ0 314 and REQ1 316. Negative edge triggered flip flops FF0 334 and FF1 336 are used to latch outgoing requests REQ0 314 and REQ1 316, respectively; this prevents changes on the ACK0 318 and ACK1 320 lines from producing spurious requests. One or more latches LD 338 in the data path, i.e., between data input D 302 and data outputs Q0 310 and Q1 312, can be controlled with enable signal EN 332. In one embodiment, enable signal EN 332 is high-active, i.e., when EN 300 is '1', data latch 338 is active (closed), and when EN 300 is '0', data latch 338 is inactive (open). The latencies exhibited by this implementation are as follows:

Forward latency: $T_{C-ELEM}+T_{LATCH}+T_{XNOR}+T_{FF}$

Reverse latency: $T_{XOR}+T_{XNOR}+T_{LATCH}$

Conditional split stage 300 may include a reset or initialization input init 340.

Figure 3B:
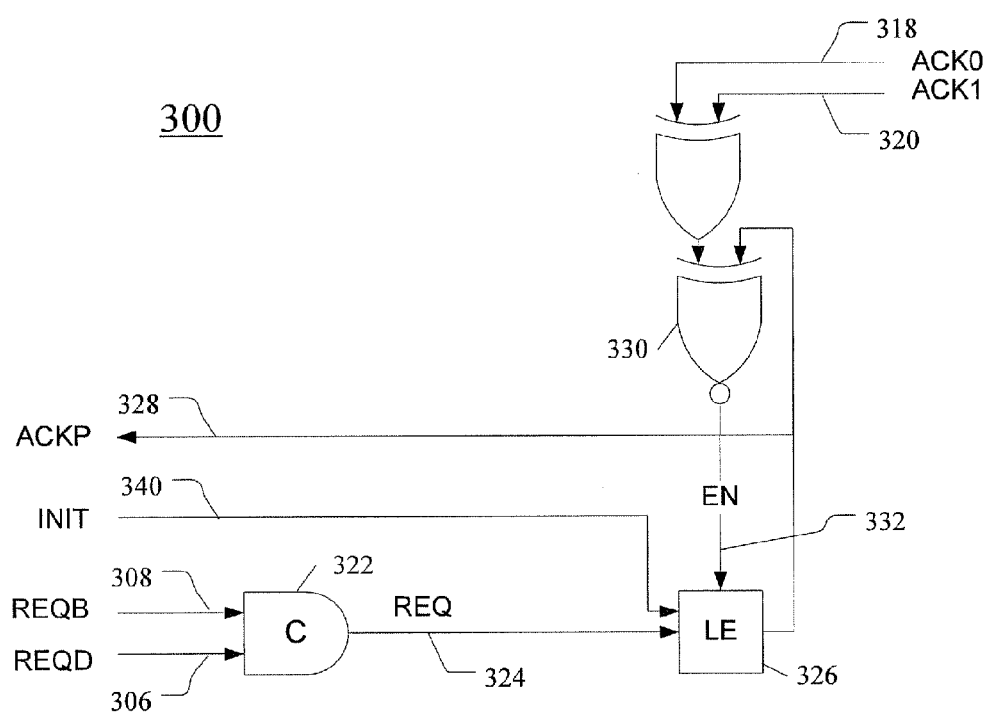
FIG. 3B is a block diagram illustrating just the reverse path of the circuit shown in FIG. 3A according to an embodiment of the subject matter described herein.

FIG. 3B is a block diagram illustrating just the reverse path, i.e., the logic that handles the acknowledgements sent back to the previous stage or stages, of the circuit shown in FIG. 3A according to an embodiment of the subject matter described herein. The forward path, i.e., the logic that controls the outgoing requests, of the circuit shown in FIG. 3A, may be further optimized, as will be described below. In the examples shown below, the reverse path remains the same. Thus, for clarity of description of the forward path optimizations, both the reverse path and the data path are omitted from FIGS. 3B and 3C.

Figure 3C:
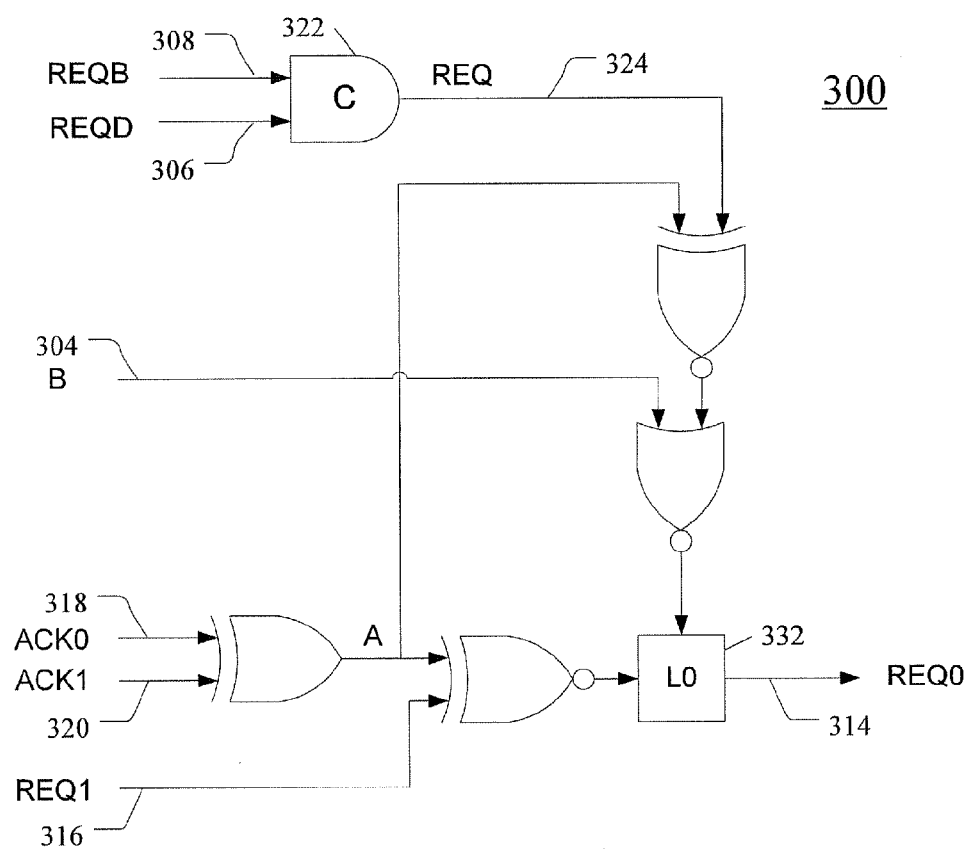
FIG. 3C is a block diagram illustrating a illustrating a conditional split stage according to another embodiment of the subject matter described herein.

FIG. 3C is a block diagram illustrating a illustrating a conditional split stage according to another embodiment of the subject matter described herein. FIG. 3B illustrates a delay-optimized implementation of conditional split stage 300. For clarity of description, the data path is omitted from FIG. 3C. While the circuits illustrated in FIGS. 3A and 3B used typical timing assumptions, further delay optimization is possible with more aggressive timing assumptions. In particular, the circuit illustrated in FIG. 3C shows a revised forward path to produce the signal REQ0 314. A similar path is used for producing the other signal, REQ1 316. The embodiment of conditional split stage 300 illustrated in FIG. 3C is based on a timing assumption that the latch must be disabled before a spurious request can race through. Using this implementation, the forward latency is as follows:

Forward latency: $T_{C-ELEM}+T_{XOR}+T_{LATCH}$

Another basic logic implementation was generated using a logic synthesis tool, such as Petrify®. By modeling the behavior of the circuit and synthesizing using Petrify®, a circuit with a more optimized forward path was generated. Boolean equations are provided below; gate-level circuit implementations can be produced directly from these equations. The equations for signals REQ0 314 and REQ1 316 are as follows (where the signal REQ 324 is assumed to represent the combination of the incoming data request input REQD 342 and select request input REQB 344, combined using C-element 322:

REQ=C-element(REQD,REQB)

REQ0=b'(REQ REQ1' a'+REQ' REQ1 a)+r0(REQ' a'+REQ a+b);

REQ1=b(REQ REQ0' a'+REQ' REQ0 a)+r1(REQ' a'+REQ a+b');

a=ACK1 ACK0'+ACK1'ACK0;

Using this implementation, the following revised forward latency holds:

Forward latency: $T_{C-ELEM}+T_{AND}+T_{OR}+T_{AND}+T_{OR}$

A generalized implementation was also created using Petrify®. The generalized C-element implementation for the forward path is as follows:

REQ=C-element(REQD,REQB)

[0]=b'(REQ REQ1' a'+REQ' REQ1 a);

[1]=b'(REQ REQ1 a'+REQ' REQ1' a);

[REQ0]=r 0 [1]'+[0]; # mappable onto gC

[3]=b(REQ a' r0'+REQ' a REQ0);

[4]=b(REQ' a r0'+REQ a' REQ0);

[REQ1]=REQ1 [4]'+[3]; # mappable onto gC

Using this implementation, the following revised forward latency holds:

Forward latency: $T_{C-ELEM}+T_{AND}+T_{OR}+T_{AND}+T_{C-ELEM}$

In one embodiment, relative timing optimizations can be applied to the circuit based on designer knowledge of the relative arrival times of signals. In one embodiment, select input B 304 may be a global constant that is assumed to be stable, and will therefore not have any associated request. In this case, the circuit becomes simpler as C-element 322 becomes unnecessary and may be removed. In other cases, select input B 304 may be part of input data D 302 (i.e., the data item carries routing information); in such cases too, there is only one request, and C-element 322 may be removed. In one embodiment, C-element 322 may be removed to improve cycle time. For example, a MOUSETRAP simple join stage may explicitly join select input B 304 and data input D 302, and the joined values are sent as one joined request to conditional split stage 300.

For clarity of description, the data path will henceforth be omitted from Figures, and the description will focus primarily on the stage handshaking signals, e.g., request signals and acknowledge signals.

Figure 4A:
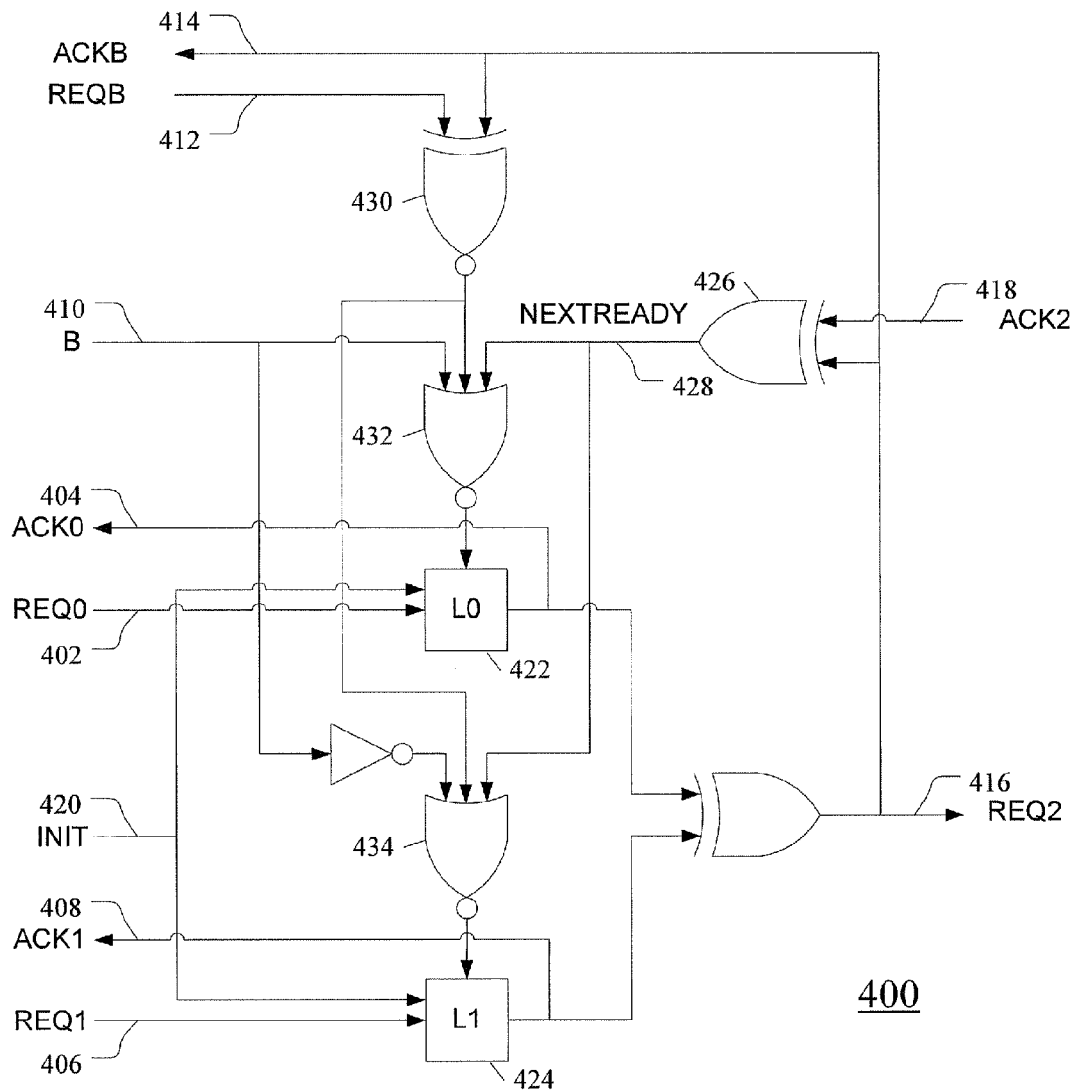
FIG. 4A is a block diagram illustrating a conditional select stage according to an embodiment of the subject matter described herein.

FIG. 4A is a block diagram illustrating a conditional select stage according to an embodiment of the subject matter described herein. A conditional select stage is similar to an event multiplexer, in that it has multiple data input channels, a select input channel, and one output channel. The behavior is to first read the "select" channel; then, based on the value of "select," read one of the multiple data channels and send the result to the output channel. In one embodiment, a conditional select stage has two data input channels, a select input channel, and one output channel.

In the embodiment illustrated in FIG. 4A, conditional select stage 400 has a first input request REQ0 402 and its associated acknowledge ACK0 404, a second input request REQ1 406 and its associated acknowledge ACK1 408, a select input B 410, its select request input REQB 412, and its associated acknowledge ACKB 414. Conditional select stage 400 has an output request REQ2 416 and its associated acknowledge ACK2 418. In one embodiment, conditional select stage 400 may have an initialization or reset input INIT 420, which may initialize latches, such as L0 422, which latches REQ0 402, and L1 424, which latches REQ1 406.

After initialization, latches L0 422 and L1 424 are opaque. The value of B 410 selects which of the two latches L0 422 and L1 424 will be made transparent. When the request associated with the select latch arrives, i.e., REQ0 402 if L0 422 is selected and REQ1 406 if L1 424 is selected, the request is sent to the next stage via REQ2 416 and latches L0 422 and L1 424 once again become opaque.

In the embodiment illustrated in FIG. 4A, request latches L0 422 and L1 424 are held opaque by NOR gates until the select input B 410 arrives, and become transparent only when all of the following are true: select input B 410 has arrived, the value of B 410 selects a given data path, and the next stage is "ready". The gate that most closely corresponds to the controller XNOR in a simple MOUSETRAP stage is the XOR 426. The following equations describe the latencies for the embodiment illustrated in FIG. 4A:

Forward latency (Boolean): $T_{XNOR}+T_{NOR}+T_{LATCH}+T_{XOR}$

Forward latency (data): $T_{LATCH}+T_{XOR}$

Reverse latency (Boolean): $T_{XOR}+T_{NOR}+T_{LATCH}+T_{XOR}$

Reverse latency (data): $T_{XOR}+T_{NOR}+T_{HATCH}$

Hold time constraint: $T_{HOLD}+T_{XOR}+T_{XOR}+T_{NOR} < (T_{XNOR}+T_{LATCH}+T_{LOGIC})$ previous stage In one embodiment, the data path can be constructed using multiplexors with select input B 410 as the select line. When the selected data input request and the select input requests are present, a latch enable signal may close the latch to store the current value. For example, in the embodiment illustrated in FIG. 4A, latches L0 422 and L1 424 can be controlled with the NEXTREADY 428 signal.

Alternative embodiments may include various options and optimizations. For example, the logic to open and close latches L0 422 and L1 424—shown in FIG. 4A using XOR 426, XNOR 430, and NOR 432, may be alternatively implemented using a two-level sum-of-products form to reduce delays. In one embodiment, select input B 410 may be a global constant that is assumed to be stable, and will therefore not have any associated request, in which case XNOR 430 is unnecessary and may be removed. In this case, since the output of XNOR 430 is no longer present, three input XNOR 432 and XNOR 434 may be replaced with two input XNORs.

Figure 4B:
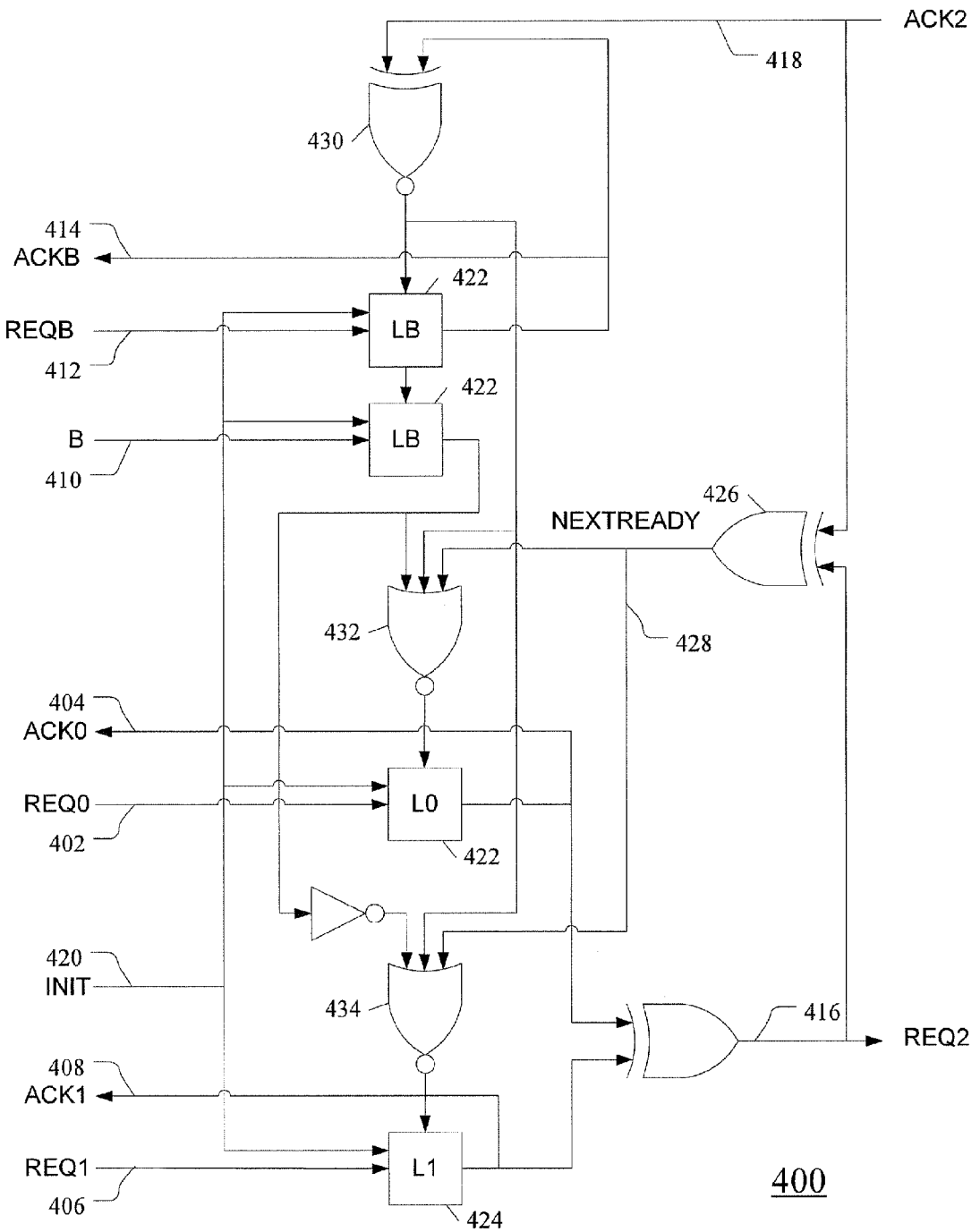
FIG. 4B is a block diagram illustrating a conditional select stage according to another embodiment of the subject matter described herein.

FIG. 4B is a block diagram illustrating a conditional select stage according to another embodiment of the subject matter described herein. In the embodiment illustrated in FIG. 4B, conditional select stage 400 had been modified to produce the ACKB 414 early, before the data has arrived. In the embodiment illustrated in FIG. 4B, the value of select input B 410 is latched so that it is available for use later, when data arrives along with the corresponding data input request, e.g., REQ0 402 or REQ1 406. This modification has a higher forward latency in cases where select input B 410 and/or its associated select input request REQB 412 arrives after the data, and thus should only be used when the designer knows that the select value will always be available before the data.

Figure 5:
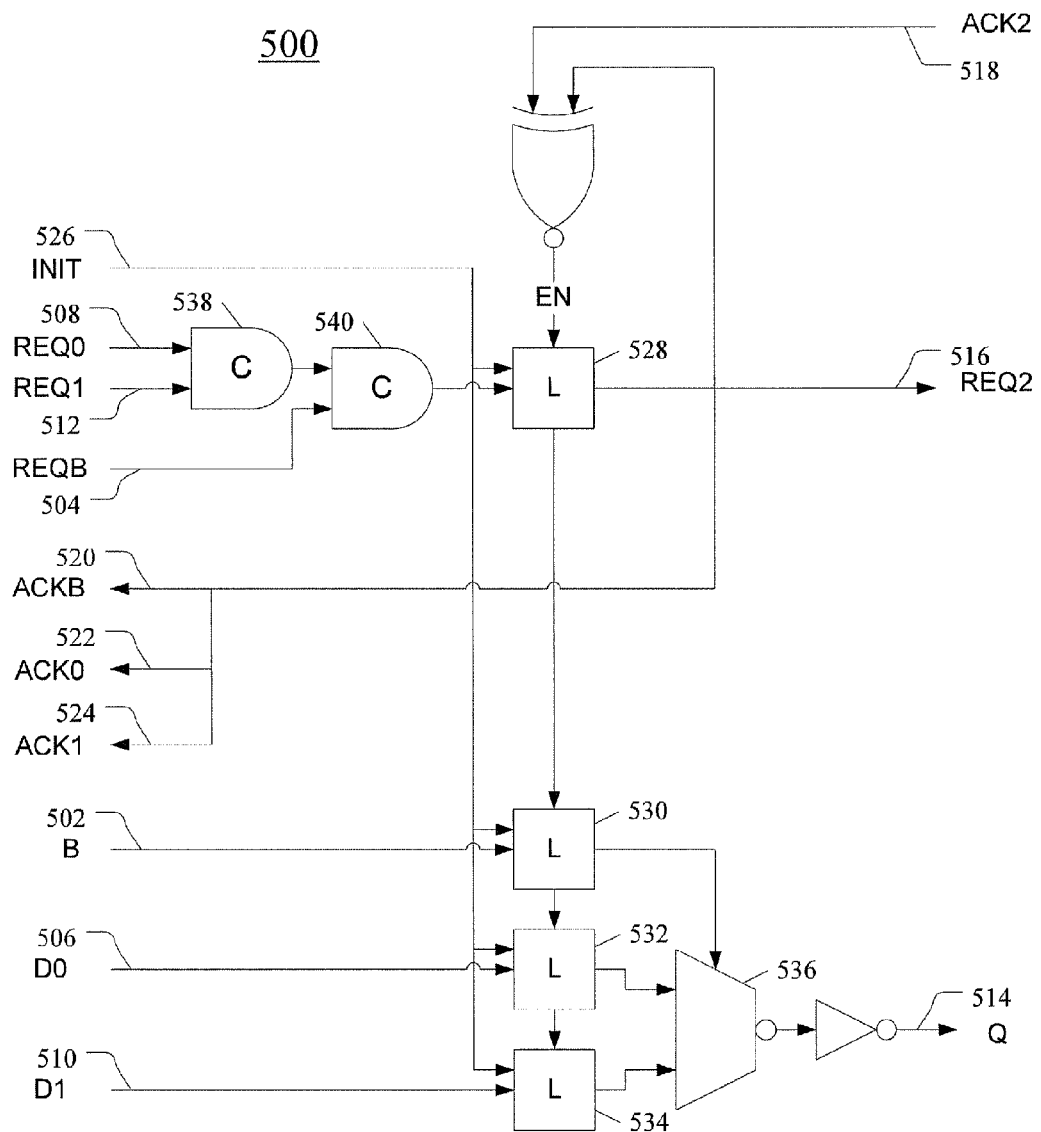
FIG. 5 is a block diagram illustrating a conditional join stage according to an embodiment of the subject matter described herein.

FIG. 5 is a block diagram illustrating a conditional join stage according to an embodiment of the subject matter described herein. A conditional join is similar to a conditional select, except that all input channels are read even though data from only one of them is forwarded; data from the remaining input channels is discarded. Thus, the handshake behavior is identical to a simple 3-way pipeline join stage. The datapath operation is identical to a combinational multiplexor. In one embodiment, a conditional join stage may have a select input channel, multiple data input channels, and one or more output channels.

In the embodiment illustrated in FIG. 5, conditional join stage 500 has the following channels: a select input B 502 and its associated select input request REQB 504; two data input channels, including data input D0 506 and its request REQ0 508 and data input D1 510 and its respective data input request and REQ1 512; and one data output channel, data output Q 514, its associated output request REQ2 516, and its associated acknowledgement ACK2 518. REQ2 516 also operates as the acknowledgements to the input channels, i.e., ACKB 520, ACK0 522, and ACK1 524. In one embodiment, conditional join stage 500 may have an initialization or reset input INIT 526, which may initialize latches, such as latch 528, which stores the combination of request inputs, latch 530, which stores the value of select input B 502, latch 532, which stores the value of data input D0 506, and latch 534, which stores the value of data input D1 510.

In one embodiment, conditional join stage 500 waits for select input B 502 and all data inputs D0 506 and D1 508 to be ready, i.e., it receives a transition on REQB 504, REQ0 508, and REQ1 512. Conditional join stage 500 acknowledges all inputs once the data is latched. Multiplexer 536 multiplexes the latched data based on the latched value of select input B 502. In one embodiment, C-elements 538 and 540 combine all incoming requests REQB 504, REQ0 508, and REQ1 512, into one request. The following equations describe the latencies for the embodiment illustrated in FIG. 5:

Forward latency: $T_{C-ELEM}+T_{LATCH}+T_{LOGIC}$

Reverse latency: $T_{XNOR}+T_{LATCH}$

In one embodiment, the selection of data values can also take place before the latches. This reduces the total number of latches, but also creates the timing assumption that the data will arrive in time to be selected before the latches become opaque.

Figure 6A:
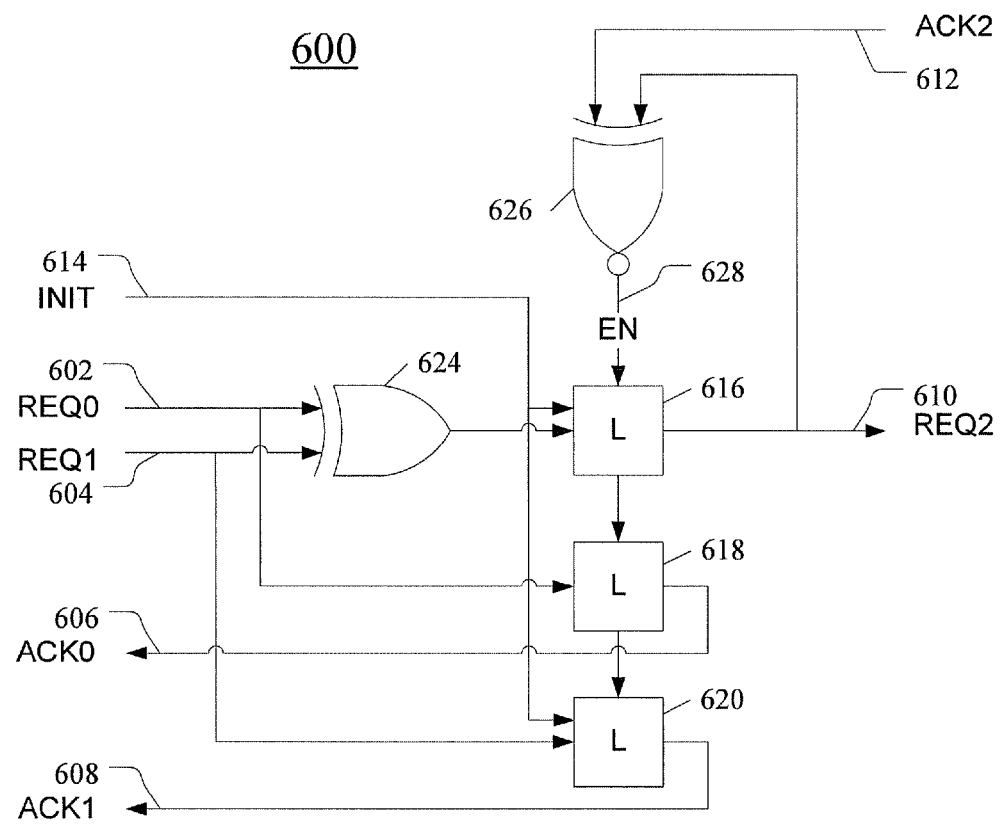
FIG. 6A is a block diagram illustrating a merge without arbitration stage ("merge stage") according to an embodiment of the subject matter described herein.

FIG. 6A is a block diagram illustrating a merge without arbitration stage ("merge stage") according to an embodiment of the subject matter described herein. This pipeline stage has multiple input channels and one output channel. Data is read from whichever input channel has new data, and then sent to the output. No arbitration is provided; it is assumed that the input channels are mutually exclusive. For simplicity, the data path is not shown in FIG. 6A, but will be shown in FIGS. 6B and 6C, below.

In the embodiment illustrated in FIG. 6A, merge stage 600 has two input channels and one output channel. For simplicity, the datapath portion of merge stage 600 is omitted. Thus, the embodiment illustrated in FIG. 6 includes data input requests REQ0 602 and REQ1 604, data input acknowledgements ACK0 606 and ACK1 608, data output request REQ2 610, and data output acknowledgment ACK2 612. In one embodiment, merge stage 600 may have an initialization or reset input INIT 614, which initializes latches, such as latch 616, which stores the combination of request inputs, latch 618, which stores the value of select input B 502, latch 620, which stores the value of data input D0 506, and latch 622, which stores the value of data input D1 510.

In one embodiment, an incoming request on either REQ0 602 or REQ1 604 will trigger a toggle on outgoing request line REQ2 610. This assumes that the two requests will not come simultaneously. In the embodiment illustrated in FIG. 6A, XOR 624 is used to combine the two incoming requests REQ0 602 and REQ1 604, such that a toggle on exactly one incoming request line will lead to a toggle on the output request. The latch control, XNOR 626, which generates latch enable signal EN 628, works similarly to a simple MOUSETRAP stage. The following equations describe the latencies for the embodiment illustrated in FIG. 6A:

Forward latency: $T_{XOR}+T_{LATCH}$

Reverse latency: $T_{XNOR}+T_{LATCH}$

In one embodiment, the datapath used with merge stage 600 depends on the previous stages used in the system. For example, an arbitration stage just before the merge stage may perform the merging of the datapath, in which case, latch enable signal EN 628 may be used to latch the data in the datapath. In this case, the data can simply be latched with latch enable signal EN 628. If the datapath has not already been merged, however, the two incoming datapaths may be multiplexed to give one output data value.

Figure 6B:
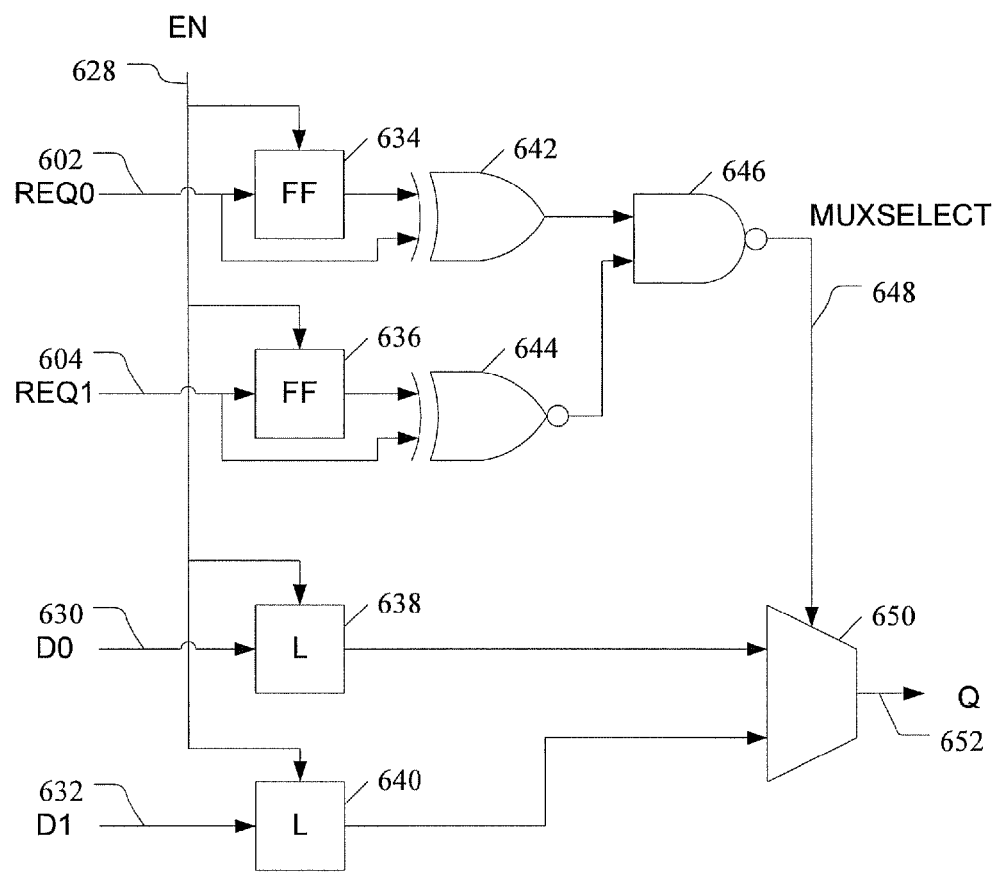
FIG. 6B is a block diagram illustrating the datapath of a merge stage implemented using flip-flops according to an embodiment of the subject matter described herein.
Figure 6C:
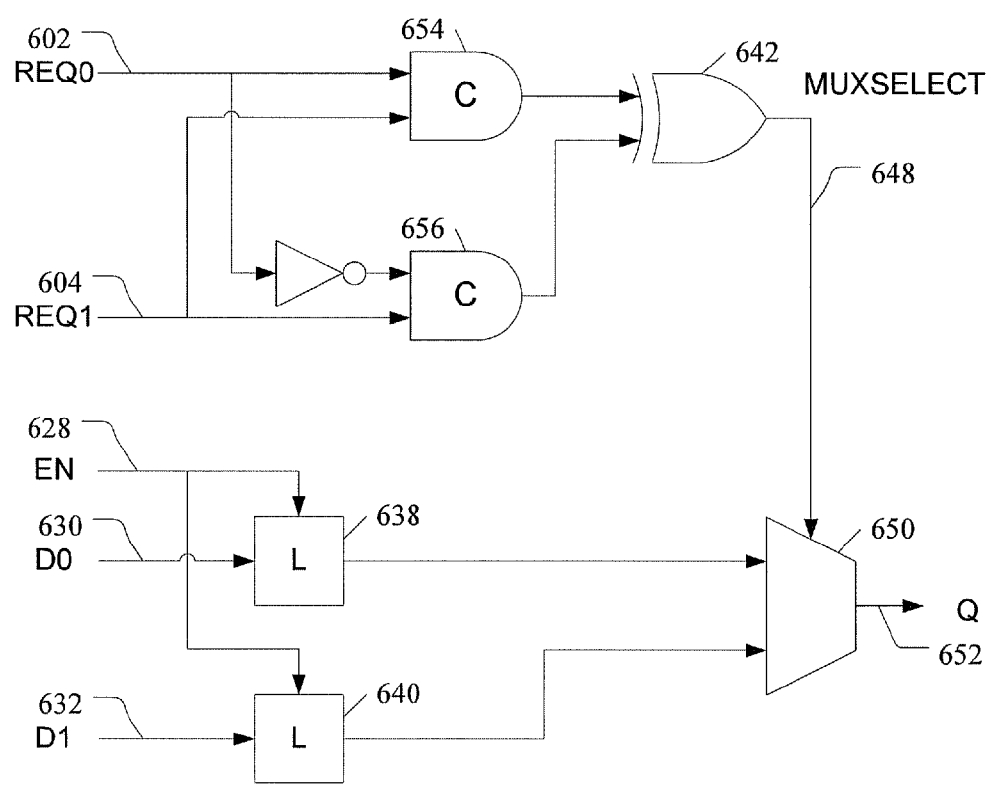
FIG. 6C is a block diagram illustrating the datapath of a merge stage implemented using C-elements according to an embodiment of the subject matter described herein.

FIGS. 6B and 6C are block diagrams illustrating two implementations of the datapath used with merge stage 600 according to an embodiment of the subject matter described herein. In both FIG. 6B and FIG. 6C, a multiplexor is used to select which data input is sent to the output.

FIG. 6B is a block diagram illustrating the datapath of a merge stage implemented using flip-flops according to an embodiment of the subject matter described herein. In the embodiment illustrated in FIG. 6B, latch enable signal EN 628 is used to latch the values of REQ0 602, REQ1 604, data input D0 630, and data input D1 632, into their respective latches 634, 636, 638, and 640. Control logic, including XOR 642, XNOR 644, and NAND 646, generates a MUXSELECT signal 648, which is sent to multiplexer 650. Multiplexer 650 selects one of multiple latched data input values and outputs the selected value as output 652.

FIG. 6C is a block diagram illustrating the datapath of a merge stage implemented using C-elements according to an embodiment of the subject matter described herein. In the embodiment illustrated in FIG. 6B, latch enable signal EN 628 is used to latch the values of data input D0 630 and data input D1 632 into their respective latches 638, and 640. Control logic, including C-elements 654 and 656 and also XOR 642, generates a MUXSELECT signal 648 based on inputs REQ0 602 and REQ1 604. MUXSELECT 648 is sent to multiplexer 650. Multiplexer 650 selects one of multiple latched data input values, e.g., from latch 638 or latch 640, and outputs the selected value as output 652.

Figure 7:
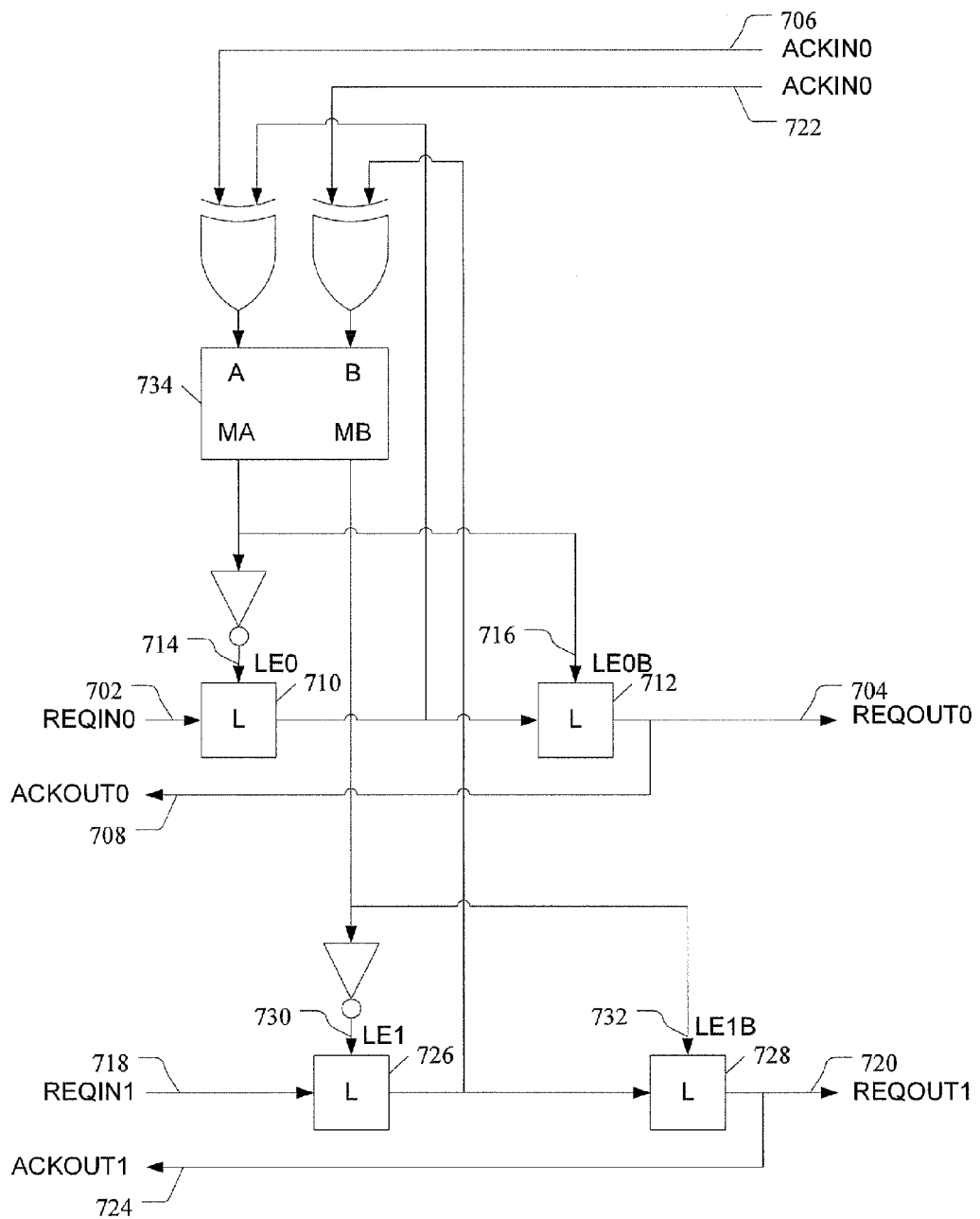
FIG. 7 is a block diagram illustrating an arbitration stage according to an embodiment of the subject matter described herein.

FIG. 7 is a block diagram illustrating an arbitration stage according to an embodiment of the subject matter described herein. This pipeline stage performs arbitration between N input channels, and produces results on N output channels. Only one input channel is read at any time, and its value is sent to its corresponding output channel. Each channel includes a request input from a previous stage, an acknowledge back to the previous stage, a request output to a next stage, and an acknowledge input from the next stage.

In the embodiment illustrated in FIG. 7, arbitration stage 700 has two channels. Channel 0 includes request input REQIN0 702, request output REQOUT0 704, acknowledge input ACKIN0 706, and acknowledge output ACKOUT0 708. Request input REQIN0 702 passes through two latches, L0 710 and L1 712 to become both REQOUT0 704 and also ACKOUT0 708. Latches L0 710 and L1 712 have complimentary latch enable signals, LE0 714 and LE0B 716, such that when one latch is open the other latch is closed, and vice versa.

Likewise, channel 1 includes request input REQIN1 718, request output REQOUT1 720, acknowledge input ACKIN1 722, and acknowledge output ACKOUT1 724. Channel 1 includes two latches, latch L2 726, latch L3 728, which have complimentary latch enable signals LE1 730 and LE1B 732. The operation of channel 1 is essentially identical to the operation of channel 0 except for the source of the latch enable signals, and the description of the operation of channel 1 will not be included here.

In the embodiment, illustrated in FIG. 7, arbitration stage 700 operates as a 2-phase wrapper around a mutually exclusive ("mutex") element 734. Arbitration stage 700 allows the earlier request that arrives on either channel to pass through, and ignores subsequent requests until the current handshake cycle is complete. In the embodiment illustrated in FIG. 7, based on whichever of REQIN0 702 or REQIN1 714 is received first, arbitration stage 700 sends a request out on one of the two outgoing request lines REQOUT0 704 or REQOUT1 716.

In one embodiment, operation begins with the first set of latches, i.e., latches 710 and 726, in transparent mode and the second set of latches, i.e., latches 712 and 728, in opaque mode. When a request arrives for a particular channel, the first latch of that channel becomes opaque, the second latch in the same channel becomes transparent, and mutex element 734 will become unresponsive to new incoming requests. The acknowledge returning from the next stage connected to that channel, e.g., ACKIN0 706 or ACKIN1 722, re-enables mutex element 734 so that incoming requests can once again be processed. The following equations describe the latencies for the embodiment illustrated in FIG. 7:

Forward latency: $T_{LATCH}+T_{XOR}+T_{MUTEX}+T_{LATCH}$

Reverse latency: $T_{XNOR}+T_{MUX}+T_{LATCHH}$

Depending on the next stages used in the embodiment, arbitration stage 700 may either maintain two separate data paths and requests, or it may merge the data paths. If two separate data paths are required, then the data latches on paths 0 and 1 will use the latch enable signals LE0 714 and LE1 730 respectively. If the paths should be merged, only a single latch enable signal may be required.

It will be understood that various details of the subject matter described herein may be changed without departing from the scope of the subject matter described herein. Furthermore, the foregoing description is for the purpose of illustration only, and not for the purpose of limitation.

What is claimed is:

1. A configurable system for constructing asynchronous application specific integrated data pipeline circuits, the system comprising:
    a plurality of modular circuit stages that are connectable with each other using transitional signaling and with other circuit elements to form multi-stage asynchronous application-specific integrated data pipeline circuits for asynchronously passing data through a series of stages based on a behavior implemented by each stage, the modular circuit stages each including sets of logic gates connected to each other for implementing the behaviors, the behaviors including at least one of conditional split, conditional select, conditional join, merge without arbitration, and stage arbitration, wherein each stage includes a data latch for receiving data sent forward from a previous stage and for transmitting the data forward to a next stage, the data latch having an open mode wherein data is passed transparently forward from the previous stage to the next stage, and a closed mode wherein the data from the previous stage is stored by the data latch and the stored value is transmitted forward to the next stage.

2. The system of claim 1 wherein the modular circuit stages include at least one stage for implementing a conditional split is configured to receive a data value from a first input, receive a selection value from a second input, and send the data value to one output that is selected from a plurality of outputs based on the selection value.

3. The system of claim 1 wherein the modular circuit stages include at least one stage for implementing a conditional select is configured to receive a selection value from a selection input and to send to a first output a data value received from one input that is selected from a plurality of inputs based on the selection value.

4. The system of claim 1 wherein the modular circuit stages include at least one stage for implementing a conditional join is configured to receive a selection value from a selection input, receive data values from each of a plurality of a data inputs, and send to a first output one of the plurality of received data values that is selected based on the selection value.

5. The system of claim 1 wherein the modular circuit stages include at least one stage for implementing a merge without arbitration is configured to receive data values from each of a plurality of data inputs and to send to a first output the data value received by whichever of the plurality of data inputs that has most recently changed, without performing arbitration between the plurality of data inputs.

6. The system of claim 1 wherein the modular circuit stages include at least one stage for implementing a stage arbitration is configured to receive a selection value from a selection input, receive data values from each of a plurality of data inputs, each data input being associated with one of a plurality of data outputs, select one of the plurality of data input based on the selection value, and send the data value received at a selected one of the plurality of data inputs to the data output associated with the selected one data input.

7. The system of claim 1 wherein at least some of the plurality of modular circuit stages are connected using channels, each channel comprising a data path for transmitting data from a sending stage to a receiving stage, a request path used by the sending stage to indicate that the data on the data path is ready for use by the receiving stage, and an acknowledge path used by the receiving stage to acknowledge to the sending stage receipt of the data by the receiving stage.

8. The system of claim 1 wherein the modular circuit stages each include
    a controller for controlling the mode of the data latch and for performing a handshaking protocol.

9. An asynchronous application specific integrated data pipeline circuit, comprising:
    a plurality of modular circuit stages that are connected with each other using transitional signaling and with other circuit elements to form multi-stage asynchronous application-specific integrated data pipeline circuits for asynchronously passing data through a series of stages based on a behavior implemented by each stage, the modular circuit stages each including sets of logic gates connected to each other for implementing the behaviors, the behaviors including at least one of conditional split, conditional select, conditional join, merge without arbitration, and stage arbitration, wherein each stage includes a data latch for receiving data sent forward from a previous stage and for transmitting the data forward to a next stage, the data latch having an open mode wherein data is passed transparently forward from the previous stage to the next stage, and a closed mode wherein the data from the previous stage is stored by the data latch and the stored value is transmitted forward to the next stage.

* * * * *